(12) United States Patent
Tomida

(10) Patent No.: US 11,563,086 B2
(45) Date of Patent: Jan. 24, 2023

(54) CONDUCTIVE STRUCTURE, METHOD OF FORMING CONDUCTIVE STRUCTURE, AND SEMICONDUCTOR DEVICE

(71) Applicant: SONY SEMICONDUCTOR SOLUTIONS CORPORATION, Kanagawa (JP)

(72) Inventor: Kazuyuki Tomida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 125 days.

(21) Appl. No.: 16/968,670

(22) PCT Filed: Jan. 22, 2019

(86) PCT No.: PCT/JP2019/001904
§ 371 (c)(1),
(2) Date: Aug. 10, 2020

(87) PCT Pub. No.: WO2019/163370
PCT Pub. Date: Aug. 29, 2019

(65) Prior Publication Data
US 2021/0005714 A1    Jan. 7, 2021

(30) Foreign Application Priority Data
Feb. 20, 2018    (JP) .............................. JP2018-028251

(51) Int. Cl.
*H01L 29/10*    (2006.01)
*H01L 21/8234*    (2006.01)
(Continued)

(52) U.S. Cl.
CPC .. *H01L 29/1033* (2013.01); *H01L 21/823412* (2013.01); *H01L 29/04* (2013.01); *H01L 29/0657* (2013.01); *H01L 29/78* (2013.01)

(58) Field of Classification Search
CPC ............... H01L 29/78696; H01L 29/04; H01L 29/0657; H01L 29/78; H01L 21/823412; H01L 29/1033
See application file for complete search history.

(56) References Cited

U.S. PATENT DOCUMENTS

2012/0256167 A1    10/2012    Heo et al.
2016/0035903 A1    2/2016    Okachi et al.
(Continued)

FOREIGN PATENT DOCUMENTS

JP    2010-267752    11/2010
JP    2012-222358    11/2012
(Continued)

OTHER PUBLICATIONS

Zhang et al, 'Properties of TiN Films Deposited by Atomic Layer Deposition for Through Silicon Via Applications, www.researchgate. net. (Year: 2010).*

(Continued)

*Primary Examiner* — Feifei Yeung Lopez
(74) *Attorney, Agent, or Firm* — Sheridan Ross P.C.

(57) ABSTRACT

To further reduce contact resistance when a current or a voltage is taken out from a metal layer.
A conductive structure including: an insulating layer; a metal layer provided on one surface of the insulating layer to protrude in a thickness direction of the insulating layer; and a two-dimensional material layer provided along outer shapes of the metal layer and the insulating layer from a side surface of the metal layer to the one surface of the insulating layer.

13 Claims, 9 Drawing Sheets

(51) Int. Cl.
  *H01L 29/06* (2006.01)
  *H01L 29/78* (2006.01)
  *H01L 29/04* (2006.01)

(56) References Cited

U.S. PATENT DOCUMENTS

2018/0033727 A1* 2/2018 Lee .................... H01L 23/5226
2020/0395473 A1* 12/2020 Hersam ............. H01L 29/42384

FOREIGN PATENT DOCUMENTS

| | | |
|---|---|---|
| JP | 2015-031666 | 2/2015 |
| JP | 2015-198194 | 11/2015 |
| JP | 6032923 B2 | 11/2016 |
| JP | 2016-21978 S | 12/2016 |
| JP | 2017-069528 | 4/2017 |
| TW | 201802948 A | 1/2018 |
| WO | WO 2014/136636 | 9/2014 |

OTHER PUBLICATIONS

International Search Report and Written Opinion prepared by the Japanese Patent Office dated Apr. 11, 2019, for International Application No. PCT/JP2019/001904.

* cited by examiner

CONDUCTIVE STRUCTURE, METHOD OF FORMING CONDUCTIVE STRUCTURE, AND SEMICONDUCTOR DEVICE

CROSS REFERENCE TO RELATED APPLICATIONS

This application is a national stage application under 35 U.S.C. 371 and claims the benefit of PCT Application No. PCT/JP2019/001904 having an international filing date of 22 Jan. 2019, which designated the United States, which PCT application claimed the benefit of Japanese Patent Application No. 2018-028251 filed 20 Feb. 2018, the entire disclosures of each of which are incorporated herein by reference.

TECHNICAL FIELD

The present disclosure relates to a conductive structure, a method of forming the conductive structure, and a semiconductor device.

BACKGROUND ART

In recent years, a two-dimensional material having a two-dimensional crystal structure has attracted attention as a next-generation material. The two-dimensional material has a layered crystal structure in which unit layers each having a two-dimensional structure are laminated, and exhibits a high carrier mobility and the like due to the crystal structure, and thus is expected to be applied to a semiconductor device.

For example, Patent Document 1 below exemplifies, as a two-dimensional material, a carbon-based two-dimensional material such as graphene, or a transition metal dichalcogenide that is a compound of a transition metal and a chalcogenide element.

CITATION LIST

Patent Document

Patent Document 1: Japanese Patent Application Laid-Open No. 2016-219788

SUMMARY OF THE INVENTION

Problems to be Solved by the Invention

However, since a conductive layer including a two-dimensional material (hereinafter, also referred to as a two-dimensional material layer) is formed in an extremely thin film, it has been difficult to form a metal layer of an electrode or the like on the two-dimensional material layer without damaging the two-dimensional material. Thus, the two-dimensional material layer cannot ensure a sufficient contact area with the metal layer, so that contact resistance with the metal layer has been increased.

Thus, the present disclosure discloses a new and improved conductive structure and method of forming the conductive structure capable of further reducing the contact resistance between the two-dimensional material layer and the metal layer, and a semiconductor device using the conductive structure.

Solutions to Problems

According to the present disclosure, a conductive structure is provided including: an insulating layer; a metal layer provided on one surface of the insulating layer to protrude in a thickness direction of the insulating layer; and a two-dimensional material layer provided along outer shapes of the metal layer and the insulating layer from a side surface of the metal layer to the one surface of the insulating layer.

Furthermore, according to the present disclosure, a method of forming a conductive structure is provided, the method including: forming a metal layer that protrudes in a thickness direction of an insulating layer on one surface of the insulating layer; and forming a two-dimensional material layer along outer shapes of the metal layer and the insulating layer from a side surface of the metal layer to the one surface of the insulating layer.

Furthermore, according to the present disclosure, a semiconductor device is provided including: an insulating layer; a source electrode and a drain electrode each provided on one surface of the insulating layer to protrude in a thickness direction of the insulating layer; a two-dimensional material layer provided along outer shapes of the one surface of the insulating layer, and the source electrode and the drain electrode, from the source electrode to the drain electrode; and a gate electrode provided in a region overlapping a part of the two-dimensional material layer, with a gate insulating film or the insulating layer sandwiched in a thickness direction of the insulating layer.

According to the present disclosure, since the two-dimensional material layer can be provided on the side surface of the metal layer, the contact area between the metal layer and the two-dimensional material layer can be further increased.

Effects of the Invention

As described above, according to the present disclosure, the contact resistance can be further reduced between the two-dimensional material layer and the metal layer.

Note that, the above-described effect is not necessarily restrictive, and, in addition to the above-described effect, or in place of the above-described effect, any of effects described in the present specification, or other effects that can be grasped from the present specification may be exhibited.

MODE FOR CARRYING OUT THE INVENTION

Preferred embodiments of the present disclosure will be described in detail below with reference to the accompanying drawings. Note that, in the present specification and the drawings, constituent elements having substantially the same functional configuration are denoted by the same reference signs, and redundant explanations will be omitted.

In each drawing referred to in the following description, the sizes of some constituent members may be exaggerated for convenience of description. Thus, the relative sizes of the constituent members illustrated in each drawing do not always accurately represent the magnitude relationship between the actual constituent members. Furthermore, in the following description, the direction in which substrates or layers are laminated may be expressed as the upward direction.

Figure 1:
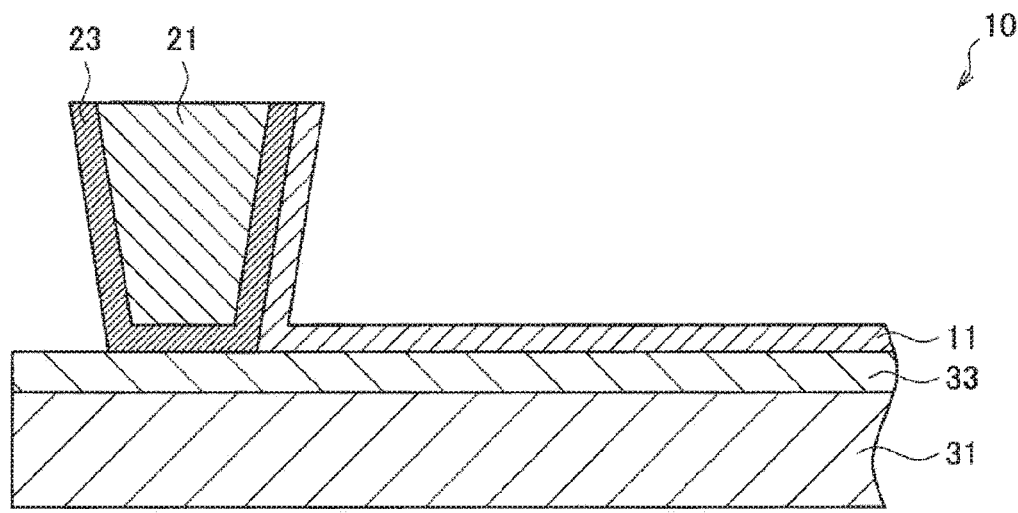
FIG. 1 is a schematic sectional view illustrating a conductive structure according to a first embodiment of the present disclosure.

Note that, the description will be given in the following order.
1. First embodiment
2. Second embodiment
2.1. Structural example
2.2. Manufacturing method
2.3. Modifications
3. Third embodiment
4. Application examples 1. First Embodiment First, a conductive structure according to a first embodiment of the present disclosure will be described with reference to FIG. 1. FIG. 1 is a schematic sectional view illustrating the conductive structure according to the present embodiment.

As illustrated in FIG. 1, a conductive structure 10 includes a substrate 31, an insulating layer 33, a metal layer 21, a barrier layer 23, and a two-dimensional material layer 11. The conductive structure 10 is a structure that electrically connects the metal layer 21 and the two-dimensional material layer 11 to each other.

The substrate 31 is a support on which constituents of the conductive structure 10 are provided. Specifically, the substrate 31 may be any member as long as it has rigidity and has a flat surface, and may be various glass substrates, resin substrates, semiconductor substrates, or the like. For example, the substrate 31 may be a glass substrate including high strain point glass, soda glass, borosilicate glass, sapphire glass, quartz glass, or the like, may be a resin substrate including resin such as polymethyl methacrylate, polyvinyl alcohol, polyimide, or polycarbonate, or may be a semiconductor substrate including Si, Ge, GaAs, GaN, SIC, or the like.

The insulating layer 33 is formed including an insulating material on the substrate 31, and insulates the metal layer 21 and the two-dimensional material layer 11 from the substrate 31. For example, the insulating layer 33 may be formed as a single layer film or a laminated film including an inorganic insulating material such as $TiO_2$, $HfO_2$, $ZrO_2$, $Ta_2O_5$, $Al_2O_3$, $Ga_2O_3$, $SiO_2$, SiN or SION, or may include hexagonal boron nitride (hBN). In particular, in a case where the two-dimensional material layer 11 described later includes transition metal dichalcogenide, the insulating layer 33 may include hexagonal boron nitride (hBN).

The metal layer 21 is formed including a conductive material on the insulating layer 33, and functions as a wiring line or an electrode for transmitting a current or a voltage. For example, the metal layer 21 may be an electrode that takes out signals from various elements of a semiconductor device. For example, the metal layer 21 may include a single metal material, or may include a laminated structure of a plurality of metal materials. The metal layer 21 may include, for example, a metal material such as W, Cu, Ti, Al, Pt, or Au, or a metal compound such as TiN or TaN.

Here, the metal layer 21 is provided on the insulating layer 33 to at least protrude. As a result, the metal layer 21 can deposit the two-dimensional material layer 11 described later on a side surface of a part protruding on the insulating layer 33. Note that, the metal layer 21 is not particularly limited in height, taper angle, and planar shape as long as the metal layer 21 is provided to protrude on the insulating layer 33.

Note that, another layer may be provided between the metal layer 21 and the two-dimensional material layer 11 as long as conductivity is maintained. For example, between the metal layer 21 and the two-dimensional material layer 11, the barrier layer 23 described later, a ground layer for improving the deposition property of the two-dimensional material layer 11 on the metal layer 21, a buffer layer for relaxing a Schottky barrier between the metal layer 21 and the two-dimensional material layer 11, or the like may be provided.

The barrier layer 23 is formed including a metal having a high barrier property on a surface of the metal layer 21, and suppresses mutual reaction between the metal layer 21 and the insulating layer 33. The barrier layer 23 includes a metal material that does not react with the materials forming the metal layer 21 and the insulating layer 33 and has high adhesion with these materials. For example, the barrier layer 23 may include a metal such as W, Ti, or Ta, or an alloy or nitride of these metals. With the material, the barrier layer 23 can function as a barrier that suppresses diffusion of the conductive material forming the metal layer 21 toward the insulating layer 33 side, for example, when the metal layer 21 is formed. Thus, the barrier layer 23 can improve electrical insulation between the metal layer 21 and the insulating layer 33 by suppressing mixing of constituent materials between the metal layer 21 and the insulating layer 33.

The two-dimensional material layer 11 is formed along outer shapes of the metal layer 21 and the insulating layer 33 from the side surface of the metal layer 21 to a surface of the insulating layer 33, and functions as a conduction path for taking out a current or a voltage from the metal layer 21. The two-dimensional material layer 11 may be provided on the entire side surface of the metal layer 21, may be provided on a part of the side surface, or may be further provided on the upper surface in addition to the side surface of the metal layer 21. The two-dimensional material layer 11 includes a two-dimensional material having a layered structure in which unit layers each having a two-dimensional structure are laminated. Since the two-dimensional material has a high carrier mobility due to the two-dimensional structure, the two-dimensional material layer 11 has conductivity and can be electrically connected to the metal layer 21.

A film thickness of the two-dimensional material layer 11 is preferably less than or equal to 10 nm. In a case where the film thickness of the two-dimensional material layer 11 is greater than 10 nm, a characteristic of the two-dimensional material layer 11 deviate from a characteristic due to the layered structure in which the unit layers each having the two-dimensional structure are laminated, and the carrier mobility decreases, which is not preferable. However, in a case where the film thickness of the two-dimensional material layer 11 is less than 0.5 nm, the two-dimensional material layer 11 is excessively thin, and there is a possibility that the unit layers of the two-dimensional material layer 11 are not formed. A lower limit of the film thickness of the two-dimensional material layer 11 may therefore be set to 0.5 nm.

As the two-dimensional material, for example, a monoatomic layered substance, a compound similar to the monoatomic layered substance, transition metal dichalcogenide, or the like can be exemplified.

The monoatomic layered substance or the compound similar to the monoatomic layered substance is a compound having a structure in which unit layers each having a two-dimensional crystal structure including a covalent bond are laminated and bonded to each other by Van der Waals force. As such a compound, graphene, black phosphorus, silicene, hexagonal boron nitride (hBN), or the like can be exemplified. The two-dimensional material layer 11 may be formed as a single layer film of one of these compounds, or may be formed as a laminated film of a plurality of these compounds.

The transition metal dichalcogenide is a compound represented by a chemical formula $MX_2$. In the chemical formula $MX_2$, M is a transition metal element such as Sc, Ti, V, Cr, Mn, Fe, Co, Ni, Cu, Ge, Zr, Nb, Mo, Ru, Rh, Pd, Sn, Hf, Ta, W, Re, Os, Ir, Pt, Au, Hg, or Pb, and X is a chalcogenide element such as S, Se, or Te. More specifically, as the transition metal dichalcogenide, $CrS_2$, $CrSe_2$, $CrTe_2$, $HfS_2$, $HfSe_2$, $HfTe_2$, $MoS_2$, $MoSe_2$, $MoTe_2$, $NiS_2$, $NiSe_2$, $SnS_2$, $SnSe_2$, $TiS_2$, $TiSe_2$, $TiTe_2$, $WS_2$, $WSe_2$, $ZrS_2$, $ZrSe_2$, $ZrTe_2$, or the like can be exemplified. The two-dimensional material layer 11 may include a single layer film of one of these compounds, or may include a laminated film of a plurality of these compounds.

Here, after the metal layer 21 is formed, the two-dimensional material layer 11 can be formed along the outer shapes of the metal layer 21 and the insulating layer 33 by performing deposition using Atomic Layer Deposition (ALD), Chemical Vapor Deposition (CVD), Physical Vapor Deposition (PVD), or the like.

In the conductive structure 10 according to the present embodiment, the two-dimensional material layer 11 is deposited from above the metal layer 21 after the metal layer 21 is formed. As a result, the two-dimensional material layer 11 can be electrically connected to the metal layer 21 on the side surface of the part of the metal layer 21 provided to protrude on the insulating layer 33. Thus, the two-dimensional material layer 11 can form conduction with the metal layer 21 without being provided with the metal layer 21 on the two-dimensional material layer 11.

For example, in a case where the metal layer 21 is brought into contact with the two-dimensional material layer 11 deposited on the insulating layer 33 from above the two-dimensional material layer 11, first, an interlayer insulating film is further deposited on the two-dimensional material layer 11 by using CVD or the like. Subsequently, an opening that penetrates the interlayer insulating film and exposes the two-dimensional material layer 11 is provided by etching, and then the barrier layer 23 and the metal layer 21 are sequentially deposited to fill the opening. However, since the two-dimensional material layer 11 is formed an extremely thin film, it is extremely difficult to stop the etching immediately after the two-dimensional material layer 11 is exposed, and there is a high possibility that the two-dimensional material layer 11 is also etched. Furthermore, even in a case where the etching can be stopped immediately after the two-dimensional material layer 11 is exposed, there is a high possibility that the two-dimensional material layer 11 is damaged by the etching. In such a case, the two-dimensional material layer 11 cannot achieve an expected carrier mobility, and increases resistance of the conductive structure 10.

In the conductive structure 10 according to the present embodiment, after the metal layer 21 is formed, the two-dimensional material layer 11 is deposited, whereby conduction is formed between the metal layer 21 and the two-dimensional material layer 11, on the side surface of the metal layer 21. Thus, the conductive structure 10 can form the conduction between the metal layer 21 and the two-dimensional material layer 11 without damaging the two-dimensional material layer 11.

On the other hand, as a structure for forming conduction between the two-dimensional material layer 11 and the metal layer 21 without bringing the metal layer 21 into contact with the two-dimensional material layer 11 from above, a structure is also under consideration for bringing a side surface of the two-dimensional material layer 11 into contact with the side surface of the metal layer 21. However, since the two-dimensional material layer 11 is formed in the extremely thin film, an area of the side surface of the two-dimensional material layer 11 is extremely small. In such a structure, a contact area is therefore also extremely small between the two-dimensional material layer 11 and the metal layer 21, so that contact resistance increases between the two-dimensional material layer 11 and the metal layer 21.

In the conductive structure 10 according to the present embodiment, since the two-dimensional material layer 11 and the metal layer 21 are brought, into contact with each other on the entire side surface of the metal layer 21, the contact area can be further increased between the two-dimensional material layer 11 and the metal layer 21. Thus, in the conductive structure 10 according to the present embodiment, the contact resistance can be further reduced between the two-dimensional material layer 11 and the metal layer 21.

Note that, the current, or voltage taken out from the metal layer 21 by the conductive structure 10 described above is transmitted to another electrode or wiring line (not illustrated) connected to the two-dimensional material layer 11 extended on the insulating layer 33. For electrical connection between the two-dimensional material layer 11 and the other electrode or wiring line, a structure similar to the conductive structure 10 described above may be used, or another conductive structure may be used.

2. Second Embodiment

2.1. Structural Example

Subsequently, a structural example of a semiconductor device according to a second embodiment of the present disclosure will be described with reference to FIG. 2. The semiconductor device according to the present embodiment is an active element or the like including the conductive structure 10 described in the first embodiment, and may be, for example, various field effect transistors (FET), diodes, bipolar transistors, solid-state imaging devices, storage devices, computing devices, or the like.

For example, the semiconductor device according to the present embodiment may be a planar FET, a Fin FET or a Gate-All-Around (GAA) FET, a rectifying diode, a photodiode or a light emitting diode, a pnp or npn bipolar transistor, or an image sensor including the conductive structure 10 described in the first embodiment.

Hereinafter, a structural example of the semiconductor device according to the present embodiment will be described by exemplifying a planar FET illustrated in FIG. 2. FIG. 2 is a plan view and a vertical sectional view schematically illustrating a structure of the semiconductor device according to the present embodiment.

Figure 2:
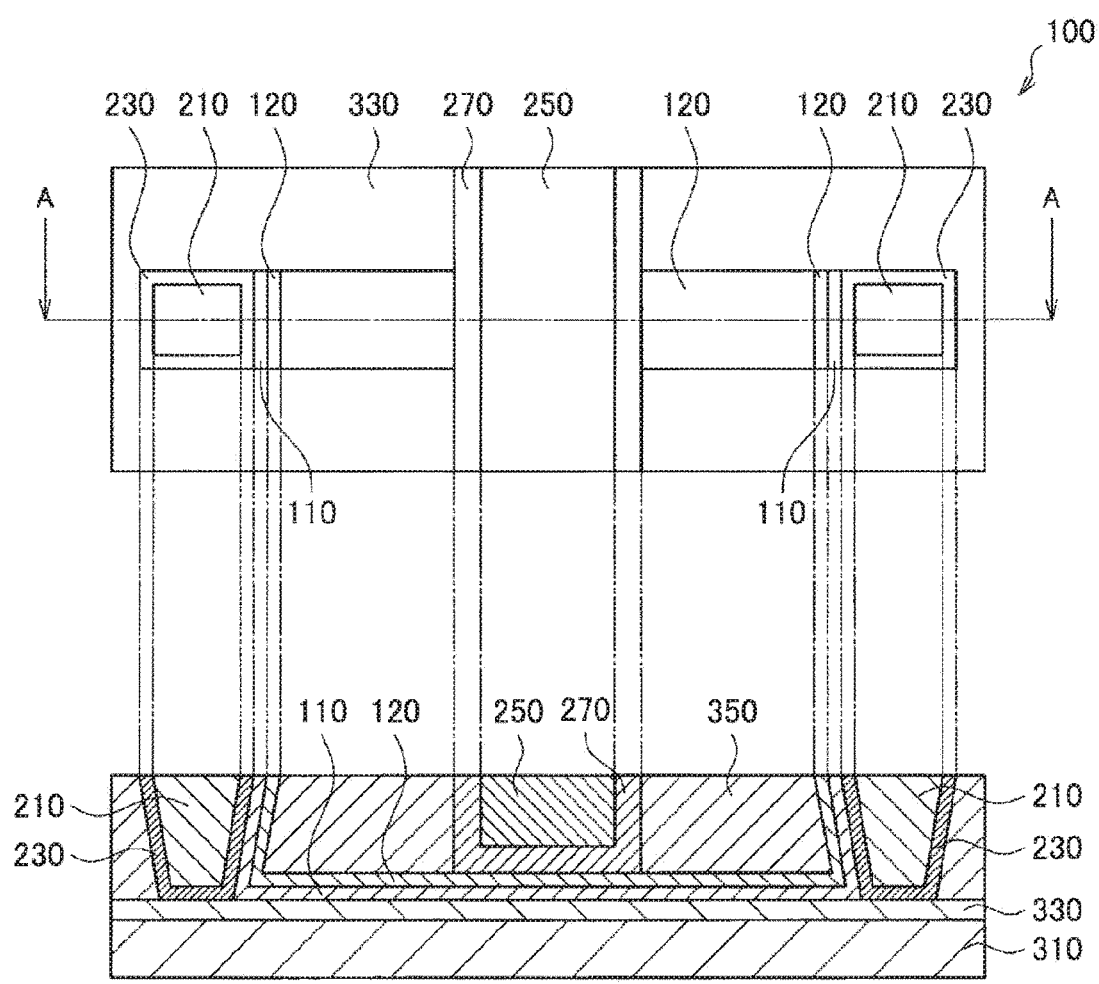
FIG. 2 is a plan views and a vertical sectional view schematically illustrating a structure of a semiconductor device according to a second embodiment of the present disclosure.

As illustrated in FIG. 2, a semiconductor device 100 includes a substrate 310, an insulating layer 330, a two-dimensional material layer 110, a gate insulating film 120, a source or drain electrode 210, a gate electrode 250, barrier layers 230 and 270, and an interlayer insulating film 350. In FIG. 2, the insulating layer 330, the source or drain electrode 210, and the two-dimensional material layer 110 form the conductive structure 10 according to the first embodiment.

The substrate 310 is a member on which the semiconductor device 100 is formed. As described above, the substrate 310 may be any of a glass substrate including high strain point glass, soda glass, borosilicate glass, sapphire glass, quartz glass, or the like, a resin substrate including resin such as polymethyl methacrylate, polyvinyl alcohol, polyimide, or polycarbonate, or a semiconductor substrate including Si, Ge, GaAs, GaN, SiC, or the like, for example.

The insulating layer 330 is provided on the substrate 310 and insulates each constituent of the semiconductor device 100 from the substrate 310. As described above, the insulating layer 330 may be formed as a single layer film or a laminated film of an inorganic insulating material such as $TiO_2$, $HfO_2$, $ZrO_2$, $Ta_2O_5$, $Al_2O_3$, $Ga_2O_3$, $SiO_2$, SiN, or SiON, or may include hexagonal boron nitride (hBN). In particular, in a case where the two-dimensional material layer 110 described later includes transition metal dichalcogenide, the insulating layer 330 may include hexagonal boron nitride (hBN).

The source or drain electrode 210 is provided on the insulating layer 330 and functions as a source terminal or a drain terminal in the semiconductor device 100 that is a planar FET. Each source or drain electrode 210 is provided to protrude on the insulating layer 330. For example, the source or drain electrode 210 may be provided in an inversely tapered quadrangular prism shape with respect to the insulating layer 330. The source or drain electrode 210 may include, for example, a metal material such as W, Cu, Ti, Al, Pt, or Au, or a metal compound such as TiN or TaN. For example, the source or drain electrode 210 may include a single metal material, or may include a laminated structure of a plurality of metal materials.

The barrier layer 230 is provided on a surface of the source or drain electrode 210, and suppresses mutual reaction between the source or drain electrode 210 and the insulating layer 33. As described above, the barrier layer 230 may include a metal such as W, Ti, or Ta that does not react with the source or drain electrode 210 and the insulating layer 330 and has high adhesion to these constituents, or an alloy or nitride of these metals.

The two-dimensional material layer 110 is provided between the source or drain electrodes 210, and functions as a channel through which carriers move in the semiconductor device 100 that is a planar FET. Specifically, the two-dimensional material layer 110 is provided along outer shapes of the source or drain electrodes 210 and the insulating layer 330 from a side surface of one of the source or drain electrodes 210 through a surface of the insulating layer 330 to a side surface of the other of the source or drain electrodes 210. For example, the two-dimensional material layer 110 may be continuously provided on at least one or more side surfaces or one of the source or drain electrodes 210 (for example, the source electrode), a region on a path connecting the source or drain electrodes 210 to each other on the surface of the insulating layer 330, and at least one or more side surfaces of the other of the source or drain electrodes 210 (for example, the drain electrode). As described above, the two-dimensional material layer 110 may include a single layer film of one of various two-dimensional materials, or may include a laminated film of a plurality of the various two-dimensional materials. Furthermore, the two-dimensional material layer 110 may be formed with a film thickness of less than or equal to 10 nm.

The gate insulating film 120 is provided on the two-dimensional material layer 110, protects the two-dimensional material layer 110, and functions as a gate insulating film in the semiconductor device 100 that is a planar FET. Specifically, similarly to the two-dimensional material layer 110, the gate insulating film 120 is provided on the dimensional material layer 110 from the side surface of one of the source or drain electrodes 210 through the surface of the insulating layer 330 to the side surface of the other of the source or drain electrodes 210. This is because the gate insulating film 120 is formed by being deposited on the source or drain electrodes 210 and the insulating layer 330 continuously with the two-dimensional material layer 110, and then being patterned simultaneously. For example, the gate insulating film 120 may include an inorganic insulating material such as $SiO_x$ or SiN, may include a high dielectric material such as $HfO_x$, or may include hexagonal boron nitride (hBN). In particular, in a case where the two-dimensional material layer 110 described later includes transition metal dichalcogenide, the gate insulating film 120 may include hexagonal boron nitride (hBN). Moreover, the gate insulating film 120 may include a single layer film, or may include a laminated film including a plurality of materials.

The gate electrode 250 is provided including a conductive material on the gate insulating film 120, and functions as a gate terminal in the semiconductor device 100 that is a planar FET. Specifically, the gate electrode 250 is provided in a region crossing a region on the insulating layer 330 where the two-dimensional material layer 110 is formed. For example, the gate electrode 250 may be provided in a region extended to be orthogonal to the two-dimensional material layer 110 extended on the surface of the insulating layer 330 to connect the source or drain electrodes 210 to each other. For example, the gate electrode 250 may include poly-Si, or may include a metal material such as W, Cu, Ti, Al, Pt, or Au, or a metal compound such as TiN or TaN. For example, the gate electrode 250 may include a single material, or may include a laminated structure of a plurality of materials.

The barrier layer 270 is formed on a surface of the gate electrode 250, and suppresses mutual reaction between the barrier layer 270 and the gate insulating film 120. Similarly to the barrier layer 230, the barrier layer 270 may include a metal such as W, Ti, or Ta that does not react with the gate electrode 250 and the gate insulating film 120 and has high adhesion to these constituents, or an alloy or nitride of these metals.

The interlayer insulating film 350 is provided including an insulating material on the insulating layer 330 to embed the semiconductor device 100. Specifically, while embedding the semiconductor device 100, the interlayer insulating film 350 exposes each of the source or drain electrodes 210 each being a terminal of the semiconductor device 100, and the gate electrode 250. As a result, the interlayer insulating film 350 can easily form a wiring line connected to each terminal of the semiconductor device 100. For example, the interlayer insulating film 350 may be formed as a single layer film or a laminated film including an inorganic insulating material such as $SiO_x$ or $SiN_x$.

In the semiconductor device 100 according to the present embodiment, by applying a voltage to the gate electrode 250, high mobility carriers can be induced at an interface between the two-dimensional material layer 110 and the gate insulating film 120 by an electric field effect. With this effect, in the semiconductor device 100, a current flowing between the source or drain electrodes 210 can be controlled by the voltage applied to the gate electrode 250. Thus, the semiconductor device 100 can be formed as a FET including the two-dimensional material layer 110 having a high carrier mobility as a channel. Such a semiconductor device 100 can operate at higher speed and lower power consumption.

Note that, as described above in the first embodiment, between the source or drain electrode 210 and the two-dimensional material layer 110, a buffer layer for relaxing a Schottky barrier between the source or drain electrode 210 and the two-dimensional material layer 110, a ground layer for improving the deposition property of the two-dimensional material layer 110 on the source or drain electrode 210, or the like may be provided.

2.2. Manufacturing Method

Subsequently, a method of manufacturing the semiconductor device 100 according to the present embodiment will be described with reference to FIGS. 3A to 3H. FIGS. 3A to 3H are schematic vertical sectional views illustrating respective steps of manufacturing the semiconductor device 100 according to the present embodiment.

Figure 3A:
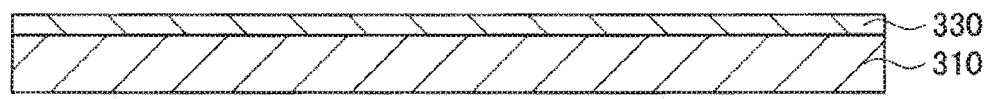
FIG. 3A is a schematic vertical sectional view illustrating one step of manufacturing the semiconductor device according to the embodiment.

First, as illustrated in FIG. 3A, the insulating layer 330 is deposited on the substrate 310. Specifically, the insulating layer 330 is formed by depositing $Al_2O_3$ or the like by using CVD or the like on the substrate 310 including silicon.

Figure 3B:
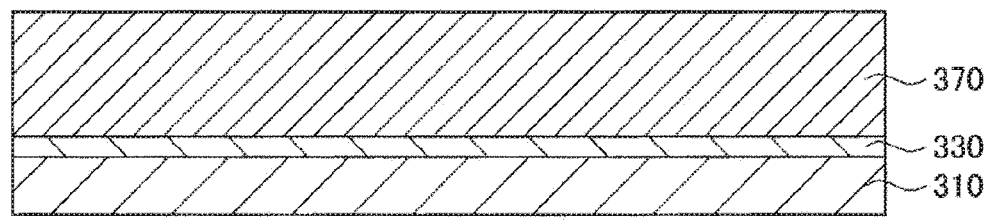
FIG. 3B s a schematic vertical sectional view illustrating one step of manufacturing the semiconductor device according to the embodiment.

Next, as illustrated in FIG. 3B, an oxide film 370 is deposited on the insulating layer 330. Specifically, the oxide film 370 is formed by depositing $SiO_x$ or the like by using CVD or the like on the insulating layer 330. Note that, the oxide film 370 may include any material as long as etching selectivity with the insulating layer 330 can be obtained.

Figure 3C:
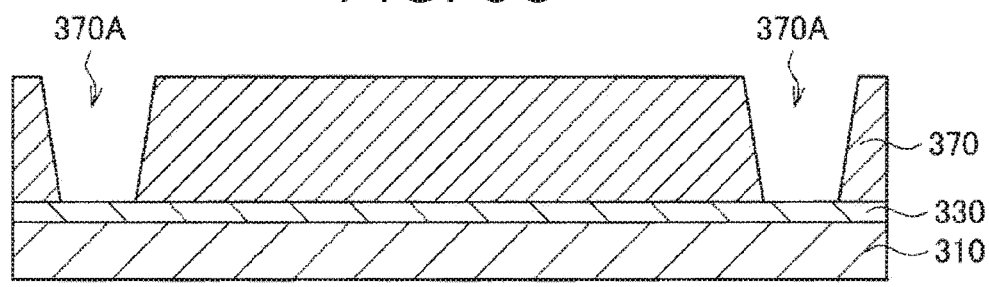
FIG. 3C is a schematic vertical sectional view illustrating one step of manufacturing the semiconductor device according to the embodiment.

Subsequently, as illustrated in FIG. 3C, an opening 370A is formed by removing a part of the oxide film 370. Specifically, etching is used to remove the oxide film 370 in a region where the source or drain electrode 210 is to be formed at a later stage, whereby the opening 370A for exposing the insulating layer 330 is formed.

Figure 3D:
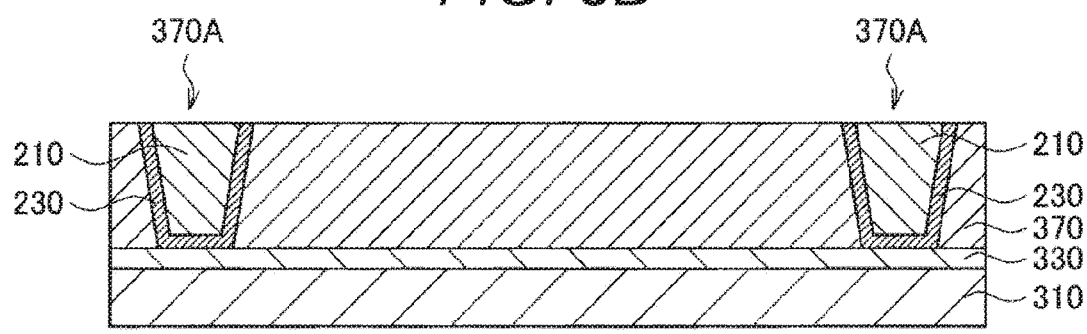
FIG. 3D is a schematic vertical sectional view illustrating one step of manufacturing the semiconductor device according to the embodiment.

Thereafter, as illustrated in FIG. 3D, the source or drain electrode 210 and the barrier layer 230 are formed to fill the opening 370A. Specifically, first, the barrier layer 230 is formed by depositing W or the like along a shape of the opening 370A by using CVD or the like. Subsequently, the source or drain electrode 210 is formed by depositing Cu or the like to fill the opening 370A from above the barrier layer 230. Note that, W, Cu, and the like deposited on the oxide film 370 can be removed by using Chemical Mechanical Polishing (CMP), overall etchback, or the like.

Figure 3E:
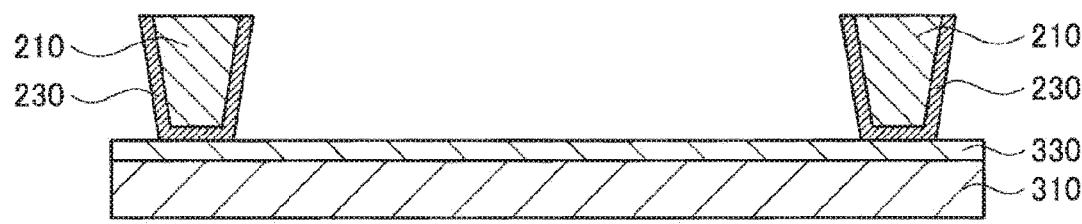
FIG. 3E is a schematic vertical sectional view illustrating one step of manufacturing the semiconductor device according to the embodiment.

Next, as illustrated in FIG. 3E, the oxide film 370 is removed. Specifically, the source or drain electrode 210 and the insulating layer 330 are exposed by selectively removing the oxide film 370 by etching or the like.

Figure 3F:
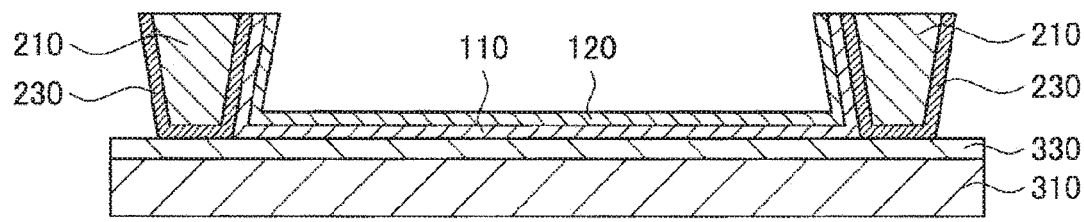
FIG. 3F is a schematic vertical sectional view illustrating one step of manufacturing the semiconductor device according to the embodiment.

Subsequently, as illustrated in FIG. 3F, the two-dimensional material layer 110 and the gate insulating film 120 are sequentially formed along the outer shapes of the source or drain electrodes 210 and the insulating layer 330. Specifically, first, a two-dimensional material such as $MoS_2$, and $SiO_2$ are sequentially deposited by using ALD, CVD, PVD, or the like. Thereafter, etching or the like is performed so that $MoS_2$ and $SiO_2$ are left that are deposited in a region where a channel is formed from one of the source or drain electrodes 210 to the other of the source or drain electrodes 210, whereby the two-dimensional material layer 110 and the gate insulating film 120 can be formed. As a result, the two-dimensional material layer 110 and the gate insulating film 120 can be formed from the side surface of the one of the source or drain electrodes 210 through the surface of the insulating layer 330 to the side surface of the other of the source or drain electrodes 210.

Figure 3G:
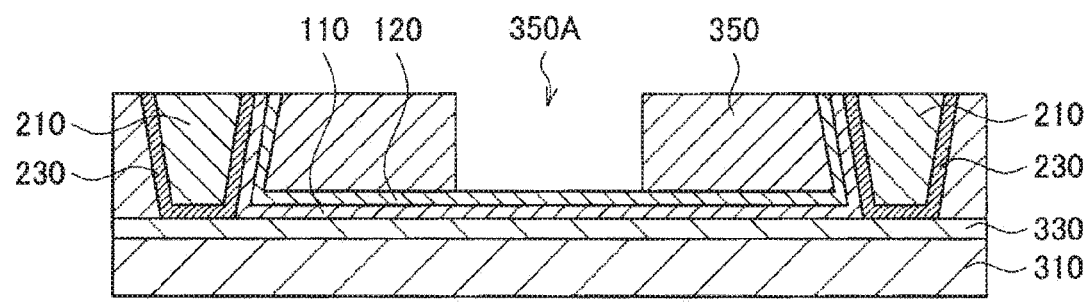
FIG. 3H is a schematic vertical sectional view illustrating one step of manufacturing the semiconductor device according to the embodiment.

Next, as illustrated in FIG. 3G, the interlayer insulating film 350 is deposited on the insulating layer 330 and the gate insulating film 120, and a part of the interlayer insulating film 350 is removed to form the opening 350A. Specifically, the interlayer insulating film 350 is formed by depositing $SiO_x$ or the like by using CVD or the like on the insulating layer 330 and the gate insulating film 120. Thereafter, etching is used to remove the interlayer insulating film 350 in a region where the gate electrode 250 is to be formed at a later stage, whereby the opening 350A for exposing the gate insulating film 120 is formed.

Figure 3H:
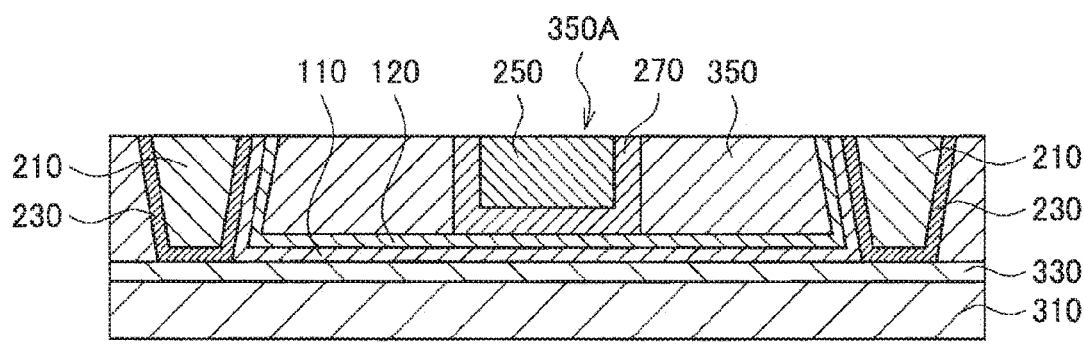

Thereafter, as illustrated in FIG. 3H, the gate electrode 250 and the barrier layer 270 are formed to fill the opening 350A. Specifically, first, the barrier layer 270 is formed by depositing W or the like along a shape of the opening 350A by using CVD or the like. Subsequently, the gate electrode 250 is formed by depositing Cu or the like to fill the opening 350A from above the barrier layer 270. Note that, W, Cu, and the like deposited on the interlayer insulating film 350 can be removed by using Chemical Mechanical Polishing (CMP), overall etchback, or the like.

Through the above steps, the semiconductor device 100 according to the present embodiment can be manufactured.

2.3. Modifications

Hereinafter, modifications of the semiconductor device 100 according to the present embodiment will be described with reference to FIGS. 4 to 8.

(First Modification)

Figure 4:
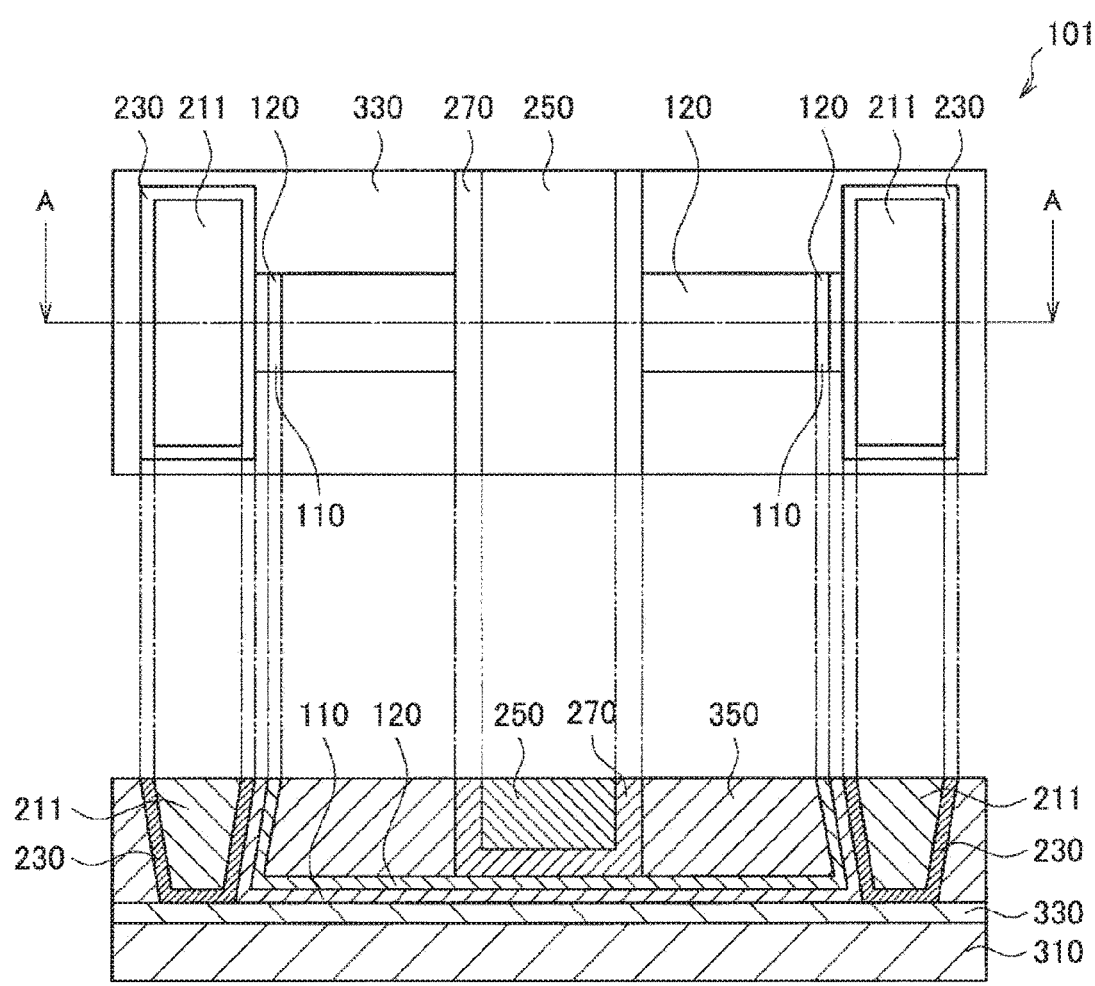
FIG. 4 is a plan view and a vertical sectional view schematically illustrating a structure of a semiconductor device according to a first modification.

First, a structure of a semiconductor device 101 according to a first modification will be described with reference to FIG. 4. FIG. 4 is a plan view and a vertical sectional view schematically illustrating the structure of the semiconductor device 101 according to the first modification.

For example, as illustrated in FIG. 4, a source or drain electrode 211 may be provided having a width greater than a width in which the two-dimensional material layer 110 is provided. Specifically, the width (or maximum length) of the source or drain electrode 211 in a direction orthogonal to a direction in which the source or drain electrodes 11 are arranged may be longer than the width of the two-dimensional material layer 110 in the same direction. In such a case, the two-dimensional material layer 110 is provided in a partial region of one side surface of four side surfaces of the source or drain electrode 211 provided in a quadrangular prism shape.

With the semiconductor device 101 according to the first modification, it is possible to increase an allowable error of alignment between the source or drain electrode 211 and the two-dimensional material layer 110. Thus, in the semiconductor device 101 according to the first modification, the allowable error during the manufacturing of the semiconductor device 101 can be further increased, so that an yield of the semiconductor device 101 can be improved and a manufacturing cost can be reduced.

(Second Modification)

Figure 5:
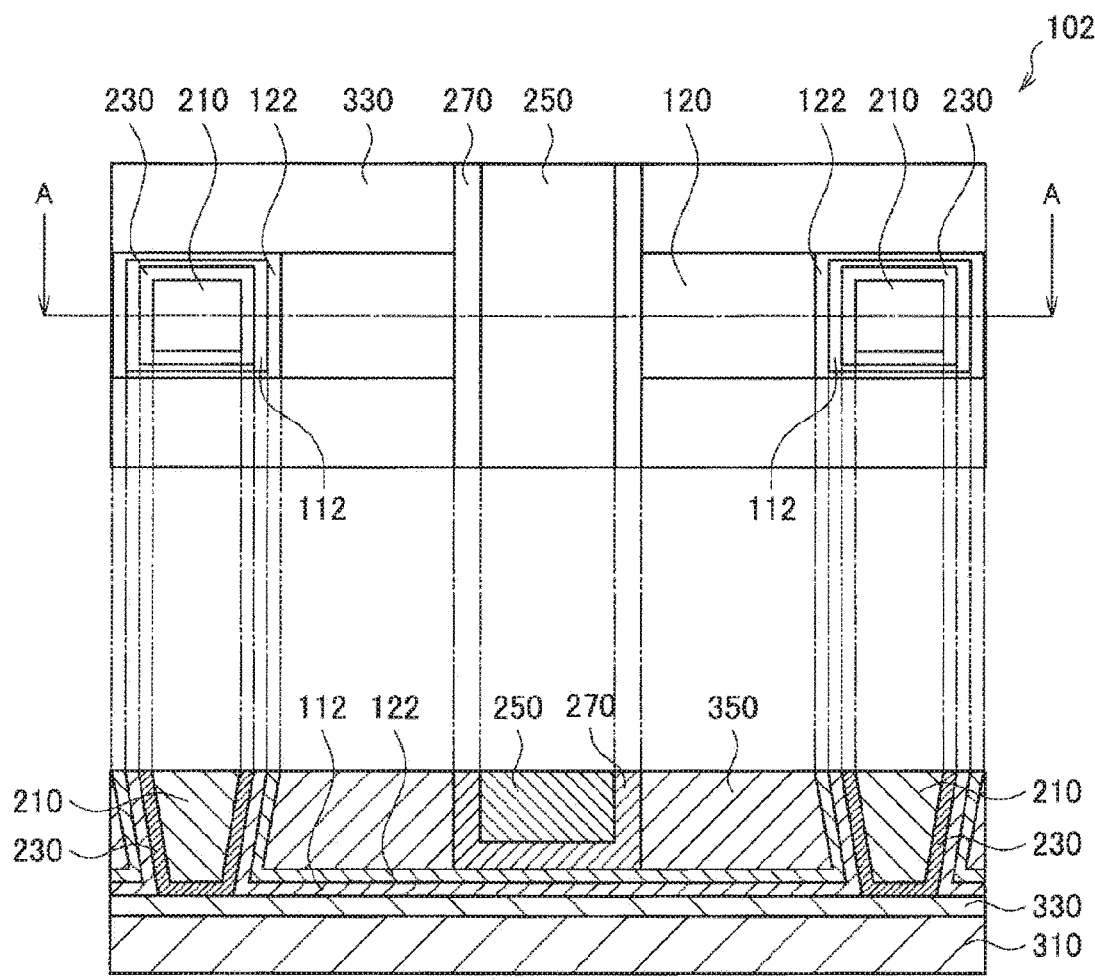
FIG. 5 is a plan view and a vertical sectional view schematically illustrating a structure of a semiconductor device according to a second modification.

Next, a structure of a semiconductor device 102 according to a second modification will be described with reference to FIG. 5. FIG. 5 is a plan view and a vertical sectional views schematically illustrating the structure of the semiconductor device 102 according to the second modification.

For example, as illustrated in FIG. 5, a two-dimensional material layer 112 and a gate insulating film 122 may be provided over the entire side surface of the source or drain electrode 210. Specifically, the two-dimensional material layer 112 and the gate insulating film 122 may be provided on all four side surfaces of the source or drain electrode 210 provided in a quadrangular prism shape. In such a case, each of the source or drain electrodes 210 is provided like an island inside a region where the two-dimensional material layer 112 and the gate insulating film 122 are provided on the surface of the insulating layer 330.

With the semiconductor device 102 according to the second modification, a contact area between the source or drain electrode 210 and the two-dimensional material layer 212 can be further increased. That is, in the semiconductor device 102 according to the second modification illustrated in FIG. 5, in comparison with the semiconductor device 100 illustrated in FIG. 2, the contact area between the source or drain electrode 210 and the two-dimensional material layer 112 can be increased by about four times. Thus, in the semiconductor device 102 according to the second modification, contact resistance can be further reduced between the source or drain electrode 210 and the two-dimensional material layer 112.

(Third Modification)

Figure 6:
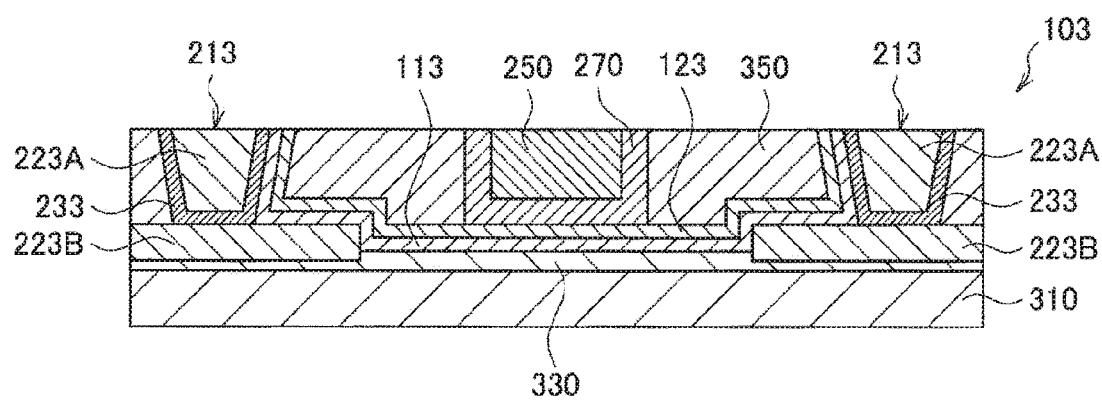
FIG. 6 is a vertical sectional view schematically illustrating a structure of a semiconductor device according to a third modification.

Subsequently, a structure of a semiconductor device 103 according to a third modification will be described with reference to FIG. 6. FIG. 6 is a vertical sectional view schematically illustrating the structure of the semiconductor device 103 according to the third modification.

For example, as illustrated in FIG. 6, a source or drain electrode 213 may include a lower electrode 223B and an upper electrode 223A, and a two-dimensional material layer 113 and a gate insulating film 123 may be provided along outer shapes of the upper electrode 223A, the lower electrode 223B, and the insulating layer 330.

Specifically, the source or drain electrode 213 may include the lower electrode 223B provided on the insulating layer 330, and the upper electrode 223A provided on the lower electrode 223B and having a planar shape smaller than that of the lower electrode 223B. In such a case, the source or drain electrode 213 is provided in an outer shape having a surface parallel to the surface of the insulating layer 330. Here, the two-dimensional material layer 113 can be provided along the outer shapes of the source or drain electrodes 213 and the insulating layer 330, and the gate insulating film 123 can be provided on the two-dimensional material layer 113 along the outer shapes of the source or drain electrodes 213 and the insulating layer 330. Specifically, the two-dimensional material layer 113 and the gate insulating film 123 can be continuously provided from a side surface of one of the upper electrodes 223A through the upper surface of one of the lower electrodes 223B, the surface of the insulating layer 330, and the upper surface of the other of the lower electrodes 223B to a side surface of the other of the upper electrodes 223A.

With the semiconductor device 103 according to the third modification, a contact area between the source or drain electrode 213 and the two-dimensional material layer 113 can be further increased. That is, in the semiconductor device 103 according to the third modification illustrated in FIG. 6, in comparison with the semiconductor device 100 illustrated in FIG. 2, the contact area between the source or drain electrode 213 and the two-dimensional material layer 113 can be increased by the amount, of the lower electrode 223B. Thus, in the semiconductor device 103 according to the third modification, contact resistance can be further reduced between the source or drain electrode 213 and the two-dimensional material layer 113.

Note that, in the semiconductor device 103 illustrated in FIG. 6, a barrier layer 233 is provided on a surface of the upper electrode 223A, but the third modification is not limited to such an example. The barrier layer 233 may be provided on surfaces of the upper electrode 223A and the lower electrode 223B, may be provided only on the surface of the lower electrode 223B, or may be provided on a surface of the source or drain electrode 213 combining the lower electrode 223B and the upper electrode 223A.

(Fourth Modification)

Figure 7:
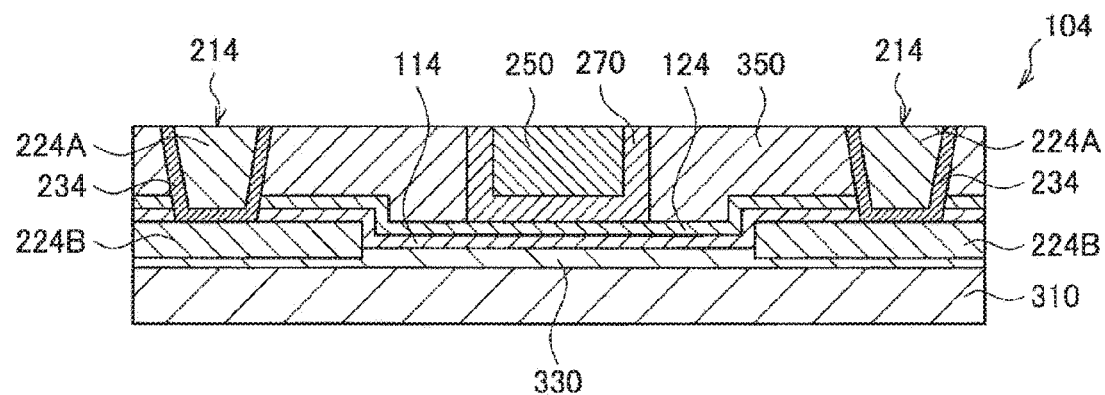
FIG. 7 is a vertical sectional view schematically illustrating a structure of a semiconductor device according to a fourth modification.

Next, a structure of a semiconductor device 104 according to a fourth modification will be described with reference to FIG. 7 FIG. 7 is a vertical sectional view schematically illustrating the structure of the semiconductor device 104 according to the fourth modification.

For example, as illustrated in FIG. 7, a source or drain electrode 214 may include a lower electrode 224B and an upper electrode 224A, and a two-dimensional material layer 114 and a gate insulating film 124 may be provided along outer shapes of the lower electrode 224B and the insulating layer 330.

Specifically, similarly to the semiconductor device 103 according to the third modification, the source or drain electrode 214 may include the lower electrode 224B provided on the insulating layer 330, and the upper electrode 224A provided on the lower electrode 224B and having a planar shape smaller than that of the lower electrode 224B. The two-dimensional material layer 114 can be provided along the outer shapes of the lower electrodes 224B and the insulating layer 330, and the gate insulating film 124 can be provided on the two-dimensional material layer 114 along the outer shapes of the lower electrodes 224B and the insulating layer 330. Specifically, the two-dimensional material layer 114 can be continuously provided from the upper surface of one of the lower electrodes 224B through the surface of the insulating layer 330 to the upper surface of the other of the lower electrodes 224B.

With the semiconductor device 104 according to the fourth modification, a sufficient contact area can be ensured between the two-dimensional material layer 114 and the source or drain electrode 214 without depositing the two-dimensional material layer 114 and the gate insulating film 124 on a side surface of the source or drain electrode 214. Thus, the semiconductor device 104 according to the fourth modification can reduce the difficulty of manufacturing the semiconductor device 104, so that a manufacturing cost of the semiconductor device 104 can be reduced.

Note that, in the semiconductor device 104 illustrated in FIG. 7, a barrier layer 234 is provided on a surface of the upper electrode 224A, but the fourth modification is not limited to such an example. The barrier layer 234 may be provided on surfaces of the upper electrode 224A and the lower electrode 224B, may be provided only on the surface of the lower electrode 224B, or may be provided on a surface of the source or drain electrode 214 combining the lower electrode 224B and the upper electrode 224A.

(Fifth Modification)

Figure 8:
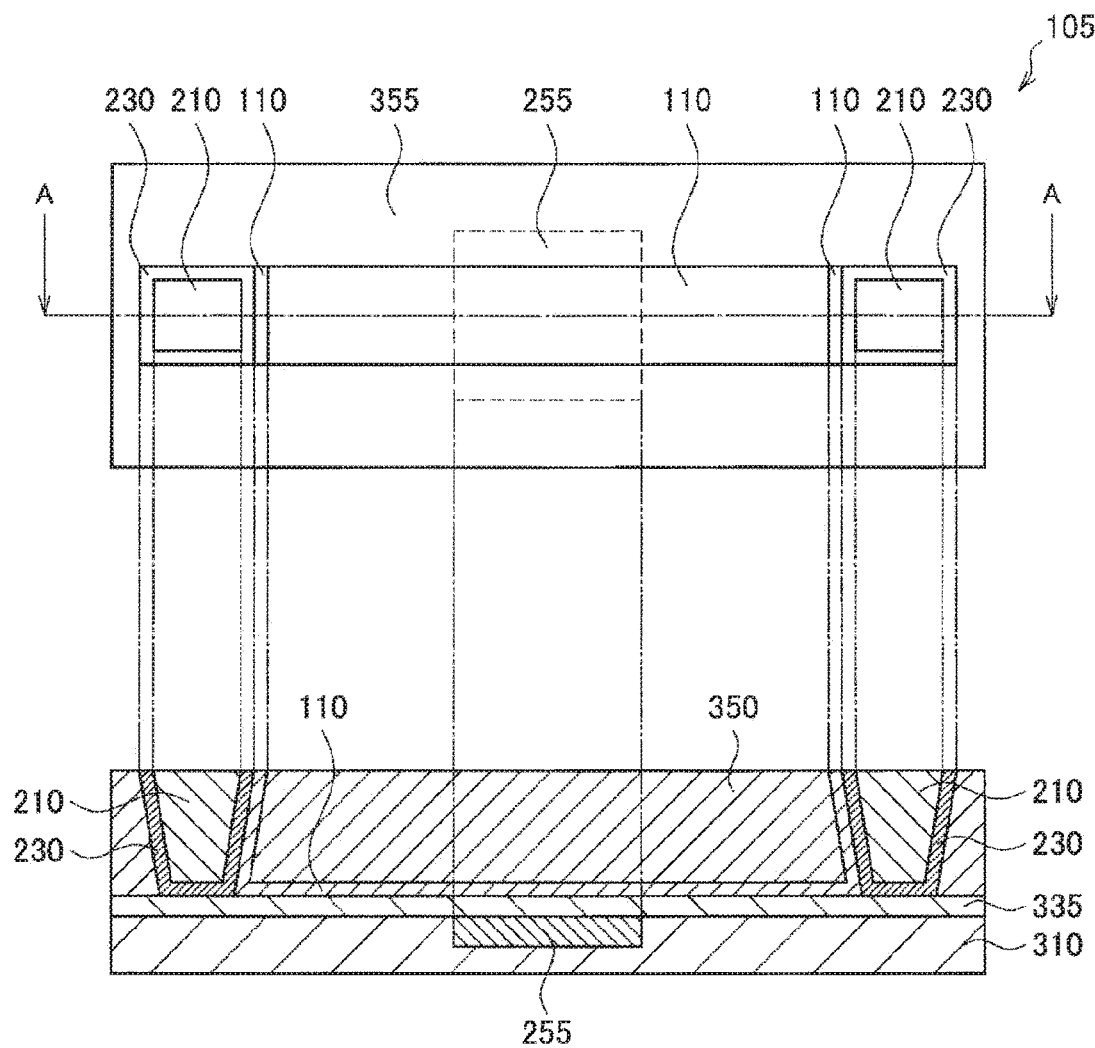
FIG. 8 is a plan view and a vertical sectional view schematically illustrating a structure of a semiconductor device according to a fifth modification.

Subsequently, a structure of a semiconductor device 105 according to a fifth modification will be described with reference to FIG. 8. FIG. 8 is a plan view and a vertical sectional view schematically illustrating the structure of the semiconductor device 105 according to the fifth modification.

For example, as illustrated in FIG. 8, a gate electrode 255 may be provided below an insulating layer 335. Specifically, the gate electrode 255 may be provided being embedded in the substrate 310 below the insulating layer 335 in a region crossing a region where the two-dimensional material layer 110 is formed. In such a case, the gate insulating film 120 is not provided on the two-dimensional material layer 110, and the insulating layer 335 functions as a gate insulating film. The insulating layer 335 may include the inorganic insulating material such as $SiO_x$ or $SiN_x$ described above as the material of the gate insulating film 120, or a high dielectric material such as $HfO_x$.

With the semiconductor device 105 according to the fifth modification, a step of depositing the gate insulating film 120 and a step of forming the gate electrode 250 by etching the interlayer insulating film 350 can be omitted. Thus, the semiconductor device 105 according to the fifth modification can reduce a manufacturing cost of the semiconductor device 105 by reducing the difficulty of manufacturing the semiconductor device 105.

Note that, the gate electrode 255 may include a metal material such as W, Cu, Ti, Al, Pt, or Au, or a metal compound such as TiN or TaN, but the fifth modification is not limited to such an example. The gate electrode 255 may be formed by making a conductivity type of impurities introduced into the substrate 310 including a semiconductor such as Si different from that of the surroundings.

3. Third Embodiment

Figure 9:
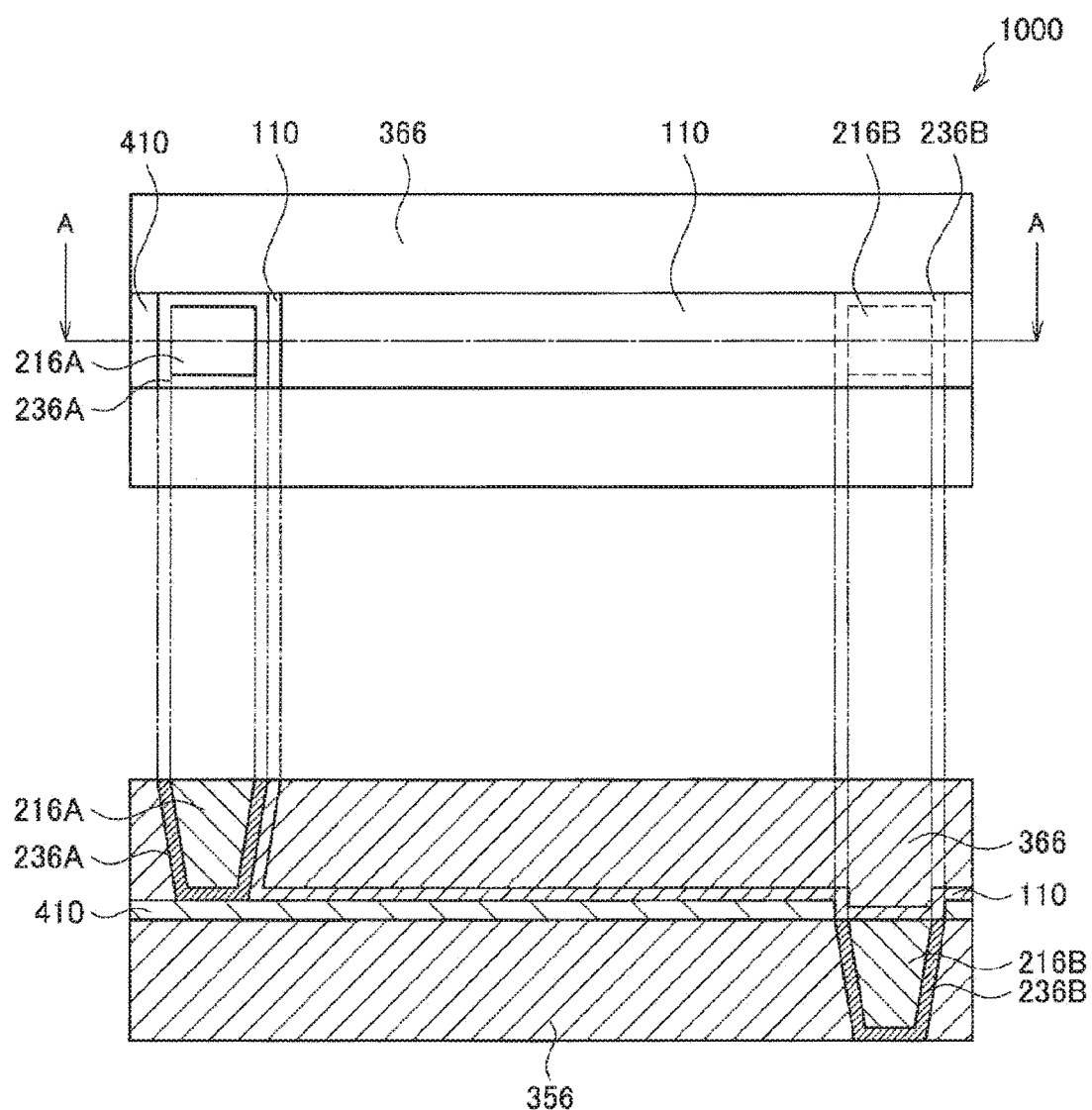
FIG. 9 is a plan view and a vertical sectional view schematically illustrating a structure of a conductive structure according to a third embodiment of the present disclosure.

Moreover, a structure of a conductive structure according to a third embodiment of the present disclosure will be described with reference to FIG. 9. FIG. 9 is a plan view and a vertical sectional view schematically illustrating the structure of the conductive structure according to the present embodiment. The conductive structure according to the present embodiment includes the conductive structure 10 described in the first embodiment, and is a conductive structure used in a Back End Of Line (BEOL) for forming a circuit by connecting active elements and the like together by wiring lines.

As illustrated in FIG. 9, a conductive structure 1000 includes a first wiring layer 216A, a first interlayer insulating film 366, a second wiring layer 216B, a second interlayer insulating film 356, barrier layers 236A and 236B, and a stopper layer 410, and the two-dimensional material layer 110. In FIG. 9, the stopper layer 410, the first wiring layer 216A, and the two-dimensional material layer 110 form the conductive structure 10 according to the first embodiment.

The first wiring layer 216A and the second wiring layer 216B are respectively provided on surface sides facing each other with respect to the two-dimensional material layer 110 and the stopper layer 410. Specifically, the first wiring layer 216A is provided to protrude on the stopper layer 410, and the second wiring layer 216B is provided on the surface side facing the surface on which the first wiring layer 216A is provided of the stopper layer 410. Here, the stopper layer 410 is provided with an opening in a region corresponding to a region where the second wiring layer 216B is provided. As a result, the two-dimensional material layer 110 is provided from a side surface of the first wiring layer 216A through one surface of the stopper layer 410 and the opening of the stopper layer 410 to the second wiring layer 216B. Thus, the conductive structure 1000 can electrically connect the first wiring layer 216A and the second wiring layer 216B to each other. That is, the two-dimensional material layer 110 is provided along outer shapes of the first wiring layer 216A, the stopper layer 410, and the second wiring layer 216B.

Note that, a material forming the first wiring layer 216A and the second wiring layer 216B may be similar to that of the source or drain electrode 210 of the semiconductor device 100 according to the second embodiment. A material forming the first interlayer insulating film 366 and the second interlayer insulating film 356 may be similar to that of the interlayer insulating film 350 of the semiconductor device 100 according to the second embodiment. Furthermore, the barrier layers 236A and 236B may be provided on surfaces of the first wiring layer 216A and the second wiring layer 216B, respectively, similarly to the barrier layer 230 of the semiconductor device 100 according to the second embodiment.

The stopper layer 410 includes an insulating material that can ensure etching selectivity with the material forming the first interlayer insulating film 366 and the second interlayer insulating film 356, and is provided between the first interlayer insulating film 366 and the second interlayer insulating film 356. As a result, the stopper layer 410 can prevent the etching from progressing penetrating the first interlayer insulating film 366 and the second interlayer insulating film 356. For example, in a case where the first interlayer insulating film 366 and the second interlayer insulating film 356 include $SiO_x$, the stopper layer 410 may include $SiN_x$.

With the conductive structure 1000 according to the third embodiment, the wiring lines that electrically connect the active elements and the like to each other can include the two-dimensional material layer 110, so that the wiring lines can be finer and have high conductivity. Thus, the conductive structure 1000 according to the third embodiment can contribute to downsizing of an integrated circuit (for example, an IC chip) in which a large number of active elements are wired to each other.

4. Application Examples

Figure 10A:
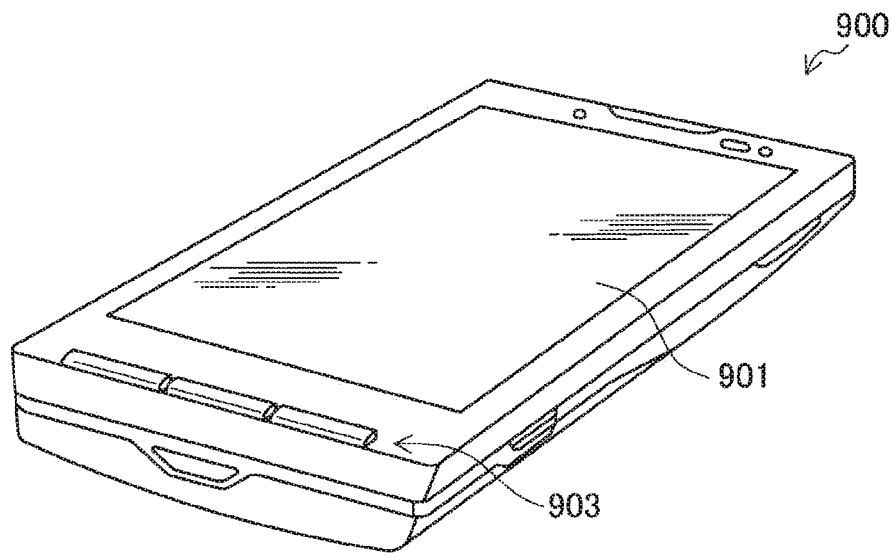
FIG. 10A is an external view illustrating an example of an electronic device in which the conductive structure or the semiconductor device according to the embodiments of the present disclosure can be mounted.
Figure 10B:
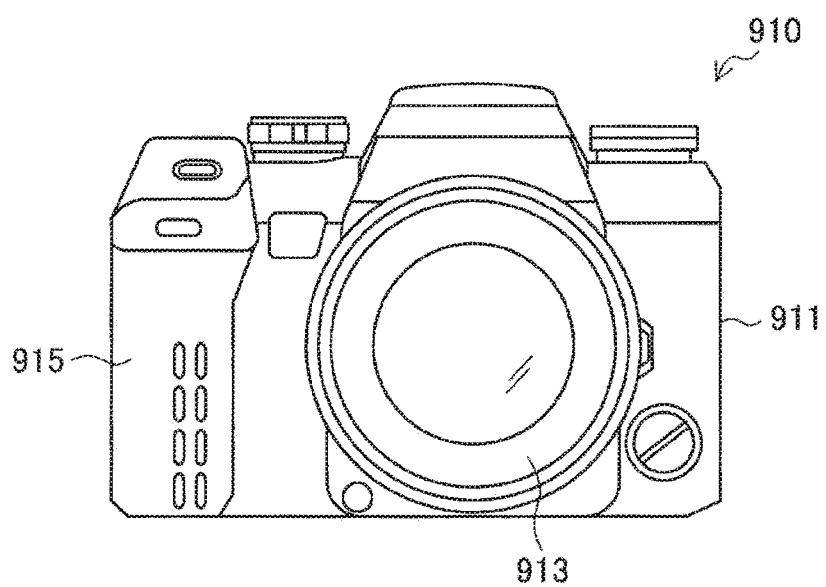
FIG. 10B is an external view illustrating an example of an electronic device in which the conductive structure or the semiconductor device according to the embodiments of the present disclosure can be mounted.
Figure 10C:
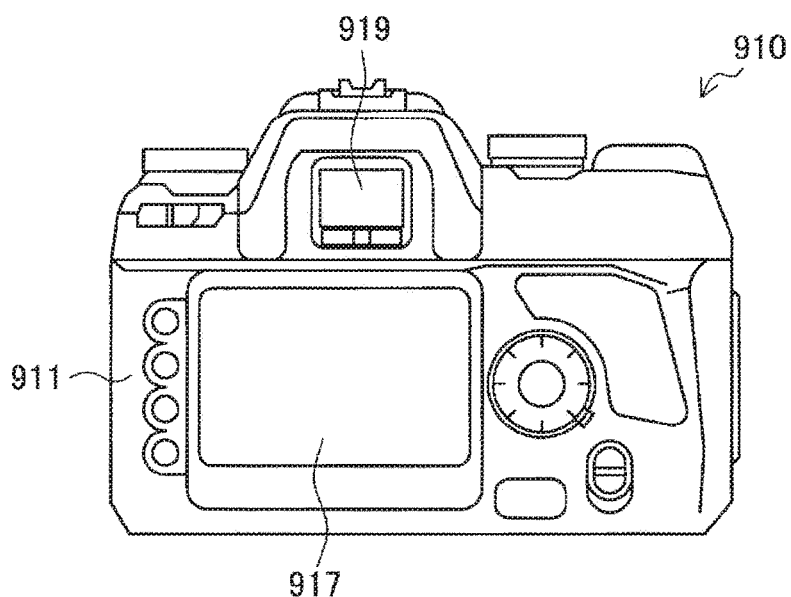
FIG. 10C is an external view illustrating an example of an electronic device in which the conductive structure or the semiconductor device according to the embodiments of the present disclosure can be mounted.

The conductive structure 10 or 1000, or the semiconductor device 100 according to the embodiment of the present disclosure can be mounted in circuits of various electronic devices. Here, with reference to FIGS. 10A to 10C, examples will be described of electronic devices in which the conductive structure 10 or 1000, or the semiconductor device 100 according to the present embodiment can be mounted. FIGS. 10A to 10C are external views illustrating examples of electronic devices in which the conductive structure 10 or 1000, or the semiconductor device 100 according to the present embodiment can be mounted.

For example, the conductive structure 10 or 1000, or the semiconductor device 100 according to the present embodiment can be mounted in a circuit of an electronic device such as a smartphone. Specifically, as illustrated in FIG. 10A, a smartphone 900 includes a display unit 901 that displays various types of information, and an operation unit 903 including buttons and the like that accept an operation input by a user. Here, the conductive structure 10 or 1000, or the semiconductor device 100 according to the present embodiment may be mounted in a control circuit that controls various operations of the smartphone 900.

For example, the conductive structure 10 or 1000, or the semiconductor device 100 according to the present embodiment can be mounted in a circuit of an electronic device such as a digital camera. Specifically, as illustrated in FIGS. 10B and 10C, a digital camera 910 includes a main body part (camera body) 911, an interchangeable lens unit 913, a grip part 915 gripped by a user at the time of imaging, a monitor unit 917 that displays various types of information, and an Electronic View Finder (EVF) 919 that displays a through image observed by the user at the time of imaging. Note that, FIG. 10B is an external view of the digital camera 910 viewed from the front (that is, a subject side), and FIG. 10C is an external view of the digital camera 910 viewed from the rear (that is, a photographer side). Here, the conductive structure 10 or 1000, or the semiconductor device 100 according to the present embodiment may be applied in a control circuit that controls various operations of the digital camera 910.

Note that, the electronic devices in which the conductive structure 10 or 1000, or the semiconductor device 100 according to the present embodiment can be mounted are not limited to the examples described above. The conductive structure 10 or 1000, or the semiconductor device 100 according to the present embodiment may be mounted in circuits of electronic devices in any field. As such electronic devices, for example, an eyeglass-type wearable device, a Head. Mounted Display (HMD), a television device, an electronic book, a Personal Digital Assistant (PDA), a laptop personal computer, a video camera, a game device, and the like can be exemplified.

In the above, the preferred embodiments of the present disclosure have been described in detail with reference to the accompanying drawings; however, the technical scope of the present disclosure is not limited to such examples. It is obvious that persons having ordinary knowledge in the technical field of the present disclosure can conceive various modification examples or correction examples within the scope of the technical idea described in the claims, and it is understood that the modification examples or correction examples also belong to the technical scope of the present disclosure.

Furthermore, the effects described in the present specification are merely illustrative or exemplary and not restrictive. That is, the technology according to the present disclosure can exhibit other effects obvious to those skilled in the art from the description of the present specification together with the above-described effects or in place of the above-described effects.

Note that, the following configurations also belong to the technical scope of the present disclosure.

(1)

A conductive structure including:

an insulating layer;

a metal layer provided on one surface of the insulating layer to protrude in a thickness direction of the insulating layer; and a two-dimensional material layer provided along outer shapes of the metal layer and the insulating layer from a side surface of the metal layer to the one surface of the insulating layer.

(2)

The conductive structure according to (1), in which the two-dimensional material layer has a layered structure in which unit layers each having a two-dimensional structure are laminated.

(3)

The conductive structure according to (1) or (2), in which the two-dimensional material layer has a film thickness of less than or equal to 10 nm.

(4)

The conductive structure according to any one of (1) to (3), in which the two-dimensional material layer is provided over an entire periphery of the side surface of the metal layer.

(5)

A method of for a conductive structure, including:

forming a metal layer that protrudes in a thickness direction of an insulating layer on one surface of the insulating layer; and forming a two-dimensional material layer along outer shapes of the metal layer and the insulating layer from a side surface of the metal layer to the one surface of the insulating layer.

(6)

A semiconductor device including:

an insulating layer;

a source electrode and a drain electrode each provided on one surface of the insulating layer to protrude in a thickness direction of the insulating layer;

a two-dimensional material layer provided along outer shapes of the one surface of the insulating layer, and the source electrode and the drain electrode, from the source electrode to the drain electrode; and a gate electrode provided in a region overlapping a part of the two-dimensional material layer, with a gate insulating film or the insulating layer sandwiched in a thickness direction of the insulating layer.

(7)

The semiconductor device according to (6), is which the two-dimensional material layer is provided from a side surface of the source electrode to a side surface of the drain electrode.

(8)

The semiconductor device according to (6) or (7), in which the gate electrode is provided in a region crossing a region where the two-dimensional material layer is provided.

(9)

The semiconductor device according to any one of (6) to (8), in which the source electrode and the drain electrode are provided on as identical surface of the insulating layer.

(10)

The semiconductor device according to (9), in which the gate electrode is provided on the one surface of the insulating layer on which the source electrode and the drain electrode are provided, with the gate insulating film sandwiched.

(11)

The semiconductor device according to any one of (6) to (10), in which the two-dimensional material layer is provided over an entire periphery of a side surface of the source electrode or the drain electrode.

(12)

The semiconductor device according to any one of (6) to (11), in which
the source electrode or the drain electrode includes a lower electrode provided on the one surface of the insulating layer, and an upper electrode having a planar shape smaller than a planar shape of the lower electrode and provided on the lower electrode, and the two-dimensional material layer is provided at least along an outer shape of the lower electrode.

REFERENCE SIGNS LIST

10 Conductive structure
11 Two-dimensional material layer
21 Metal layer
23 Barrier layer
31 Substrate
33 Insulating layer
100, 101, 102, 103, 104, 105 Semiconductor device
110, 112, 113, 114 Two-dimensional material layer
120, 122, 123, 124 Gate insulating film
210, 211, 213, 214 Drain electrode
223A, 224A Upper electrode
223B, 224B Lower electrode
230, 233, 234, 270 Barrier layer
250, 255 Gate electrode
310 Substrate
330, 335 Insulating layer
350 Interlayer insulating film

What is claimed is:

1. A conductive structure comprising:
an insulating layer;
a source electrode and a drain electrode each provided on a first surface of the insulating layer to protrude in a thickness direction of the insulating layer;
a two-dimensional material layer provided along outer shapes of the first surface of the insulating layer, the source electrode, and the drain electrode, from the source electrode to the drain electrode, wherein the two-dimensional material layer is provided over an entire periphery of a side surface of the source electrode and an entire periphery of a side surface of the drain electrode; and
a gate electrode provided in a region overlapping a part of the two-dimensional material layer, with a gate insulating film between the gate electrode and the insulating layer.

2. The conductive structure according to claim 1, wherein the two-dimensional material layer has a layered structure in which unit layers each having a two-dimensional structure are laminated.

3. The conductive structure according to claim 1, wherein the two-dimensional material layer has a film thickness of less than or equal to 10 nm.

4. A method of forming a conductive structure, comprising:
forming an insulating layer;
forming a source electrode and a drain electrode each provided on a first surface of the insulating layer to protrude in a thickness direction of the insulating layer;
forming a two-dimensional material layer along outer shapes of the first surface of the insulating layer, the source electrode, and the drain electrode, from the source electrode to the drain electrode, wherein the two-dimensional material layer is provided over an entire periphery of a side surface of the source electrode and an entire periphery of a side surface of the drain electrode; and
a gate electrode provided in a region overlapping a part of the two-dimensional material layer, with a gate insulating film between the gate electrode and the insulating layer.

5. A semiconductor device comprising:
an insulating layer;
a source electrode and a drain electrode each provided on a first surface of the insulating layer to protrude in a thickness direction of the insulating layer;
a two-dimensional material layer provided along outer shapes of the first surface of the insulating layer, the source electrode, and the drain electrode, from the source electrode to the drain electrode, wherein the two-dimensional material layer is provided over an entire periphery of a side surface of the source electrode and an entire periphery of a side surface of the drain electrode; and
a gate electrode provided in a region overlapping a part of the two-dimensional material layer, with a gate insulating film between the gate electrode and the insulating layer.

6. The semiconductor device according to claim 5, wherein the gate electrode is provided in the region crossing a region where the two-dimensional material layer is provided.

7. The semiconductor device according to claim 5, wherein the source electrode and the drain electrode are provided on an identical surface of the insulating layer.

8. The semiconductor device according to claim 7, wherein the gate electrode is provided on the first surface of the insulating layer on which the source electrode and the drain electrode are provided, with the gate insulating film between the first surface of the insulating layer and the gate insulating film.

9. The semiconductor device according to claim 5, wherein the source electrode or the drain electrode include a lower electrode provided on the first surface of the insulating layer, wherein an upper electrode having a planar shape smaller than a planar shape of the lower electrode is provided on the lower electrode, and wherein the two-dimensional material layer is provided at least along an outer shape of the lower electrode.

10. The conductive structure according to claim 1, wherein the gate electrode is provided in the region crossing a region where the two-dimensional material layer is provided.

11. The conductive structure according to claim 1, wherein the source electrode and the drain electrode are provided on an identical surface of the insulating layer.

12. The conductive structure according to claim 11, wherein the gate electrode is provided on the first surface of the insulating layer on which the source electrode and the drain electrode are provided, with the gate insulating film between the first surface of the insulating layer and the gate insulating film.

13. The conductive structure according to claim 1, wherein the source electrode or the drain electrode include a lower electrode provided on the first surface of the insulating layer, wherein an upper electrode having a planar shape smaller than a planar shape of the lower electrode is provided on the lower electrode, and wherein the two-dimensional material layer is provided at least along an outer shape of the lower electrode.

\* \* \* \* \*